(12) United States Patent
Arayashiki

(10) Patent No.: US 9,166,157 B2
(45) Date of Patent: Oct. 20, 2015

(54) CONDUCTIVE BRIDGING MEMORY DEVICE AND METHOD FOR MANUFACTURING SAME

(75) Inventor: Yusuke Arayashiki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 273 days.

(21) Appl. No.: 13/596,445

(22) Filed: Aug. 28, 2012

(65) Prior Publication Data

US 2013/0161582 A1    Jun. 27, 2013

(30) Foreign Application Priority Data

Dec. 27, 2011  (JP) ................. 2011-286094

(51) Int. Cl.
  *H01L 47/00* (2006.01)
  *H01L 45/00* (2006.01)
  *H01L 27/24* (2006.01)

(52) U.S. Cl.
  CPC .......... *H01L 45/085* (2013.01); *H01L 27/2409* (2013.01); *H01L 27/2472* (2013.01); *H01L 27/2481* (2013.01); *H01L 45/1233* (2013.01); *H01L 45/1266* (2013.01); *H01L 45/1675* (2013.01); *H01L 27/24* (2013.01); *H01L 45/04* (2013.01)

(58) Field of Classification Search
  CPC ................................ H01L 45/04; H01L 27/24
  USPC .................................................. 365/148, 158
  See application file for complete search history.

(56) References Cited

U.S. PATENT DOCUMENTS

| 7,382,647 | B1 * | 6/2008 | Gopalakrishnan ............ 365/163 |
| 2005/0162883 | A1 * | 7/2005 | Nejad et al. ...................... 365/63 |
| 2007/0114508 | A1 * | 5/2007 | Herner et al. ...................... 257/2 |
| 2007/0228354 | A1 | 10/2007 | Scheuerlein |
| 2008/0314738 | A1 | 12/2008 | Gopalakrishnan et al. |
| 2008/0314739 | A1 | 12/2008 | Gopalakrishnan et al. |
| 2009/0242868 | A1 | 10/2009 | Kurotsuchi et al. |
| 2010/0264393 | A1 | 10/2010 | Mikawa et al. |

FOREIGN PATENT DOCUMENTS

| JP | 2011-49581 | 3/2011 |
| WO | WO 03/085675 A2 | 10/2003 |
| WO | WO 2011/159705 A2 | 12/2011 |

OTHER PUBLICATIONS

Notification of Reason(s) for Refusal issued by the Japanese Patent Office on Oct. 2, 2014, for Japanese Patent Application No. 2011-286094, and English-language translation thereof.

* cited by examiner

*Primary Examiner* — Dale E Page
(74) *Attorney, Agent, or Firm* — Finnegan, Henderson, Farabow, Garrett & Dunner, L.L.P.

(57) ABSTRACT

According to one embodiment, a conductive bridging memory device includes a first wiring layer having a plurality of first wiring portions extending in a first direction, a second wiring layer having a plurality of second wiring portions extending in a second direction crossing the first direction, and a resistance change layer provided continuously along a plane having the first direction and the second direction between the first wiring layer and the second wiring layer. Each of the first wiring portions includes a first wiring extending in the first direction. Each of the second wiring portions includes a second wiring extending in the second direction, and an ion metal layer provided between the second wiring and the resistance change layer and extending in the second direction.

5 Claims, 12 Drawing Sheets

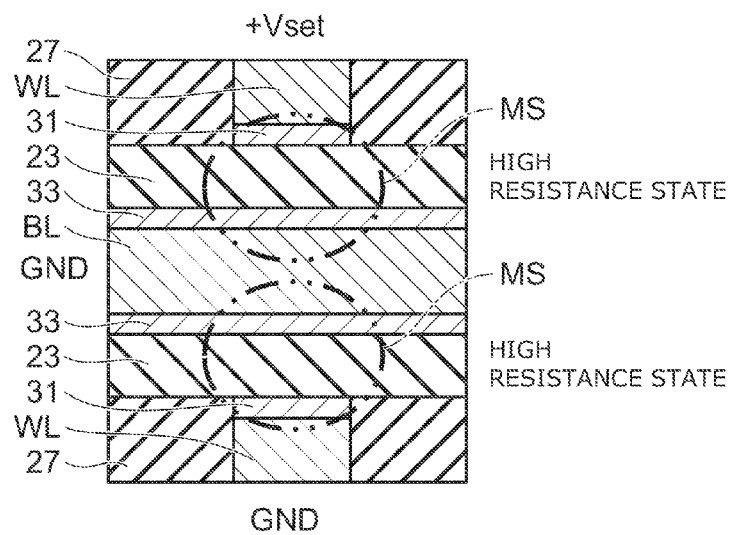
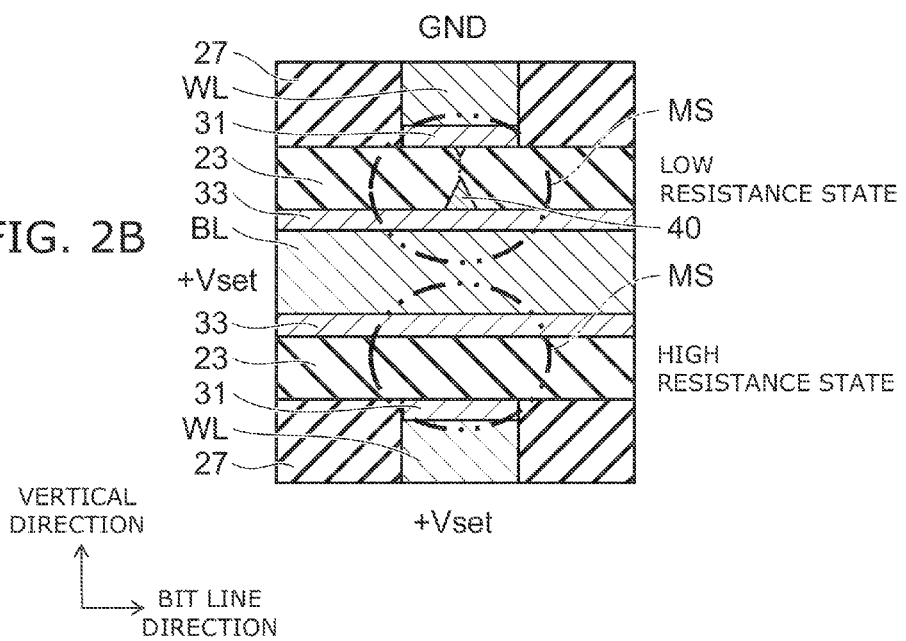
FIG. 2A
FIG. 2B

VERTICAL DIRECTION
WORD LINE DIRECTION

CONDUCTIVE BRIDGING MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-286094, filed on Dec. 27, 2011; the entire contents of which are incorporated herein by reference.

FIELD

Embodiments described herein relate generally to a conductive bridging memory device and a method for manufacturing the same.

BACKGROUND

Recently, planar nonvolatile semiconductor memory devices have been close to the limit of miniaturization of memory cells. Thus, there are a number of proposals for next-generation memory devices in which memory cells are three-dimensionally arranged. Among them, the so-called cross-point memory is considered to be advantageous to increasing the degree of integration. The cross-point memory is a memory device in which memory cells are arrayed, each memory cell including a variable resistance element and connected to the intersection (cross point) of a word line and a bit line.

On the other hand, there are also proposals for memory cells, such as ferroelectric random access memory (FeRAM), magnetoresistive random access memory (MRAM), phase change random access memory (PCRAM), resistance random access memory (ReRAM), molecular memory, and conductive bridging random access memory (CBRAM). However, a cross point memory device including such memory cells is also made difficult to manufacture with the miniaturization of memory cells.

BRIEF DESCRIPTION OF THE DRAWINGS

FIGS. 2A and 2B are sectional views illustrating an operation of the conductive bridging memory device according to the first embodiment;

DETAILED DESCRIPTION

In general, according to one embodiment, a conductive bridging memory device includes a first wiring layer having a plurality of first wiring portions extending in a first direction, a second wiring layer having a plurality of second wiring portions extending in a second direction crossing the first direction, and a resistance change layer provided continuously along a plane having the first direction and the second direction between the first wiring layer and the second wiring layer. Each of the first wiring portions includes a first wiring extending in the first direction. Each of the second wiring portions includes a second wiring extending in the second direction, and an ion metal layer provided between the second wiring and the resistance change layer and extending in the second direction.

In general, according to one embodiment, a method for manufacturing a conductive bridging memory device, includes fabricating a structural body in which first wirings extending in a first direction and first interwiring insulating films extending in the first direction are alternately arranged, forming a resistance change layer on the structural body, forming an ion metal layer on the resistance change layer, forming a plurality of second wirings extending in a second direction crossing the first direction and spaced from each other on the ion metal layer, dividing the ion metal layer without dividing the resistance change layer by performing anisotropic etching using the second wirings as a mask, and forming a second interwiring insulating film between the second wirings.

Embodiments of the invention will now be described with reference to the drawings.

First, a first embodiment is described.

Figure 1:
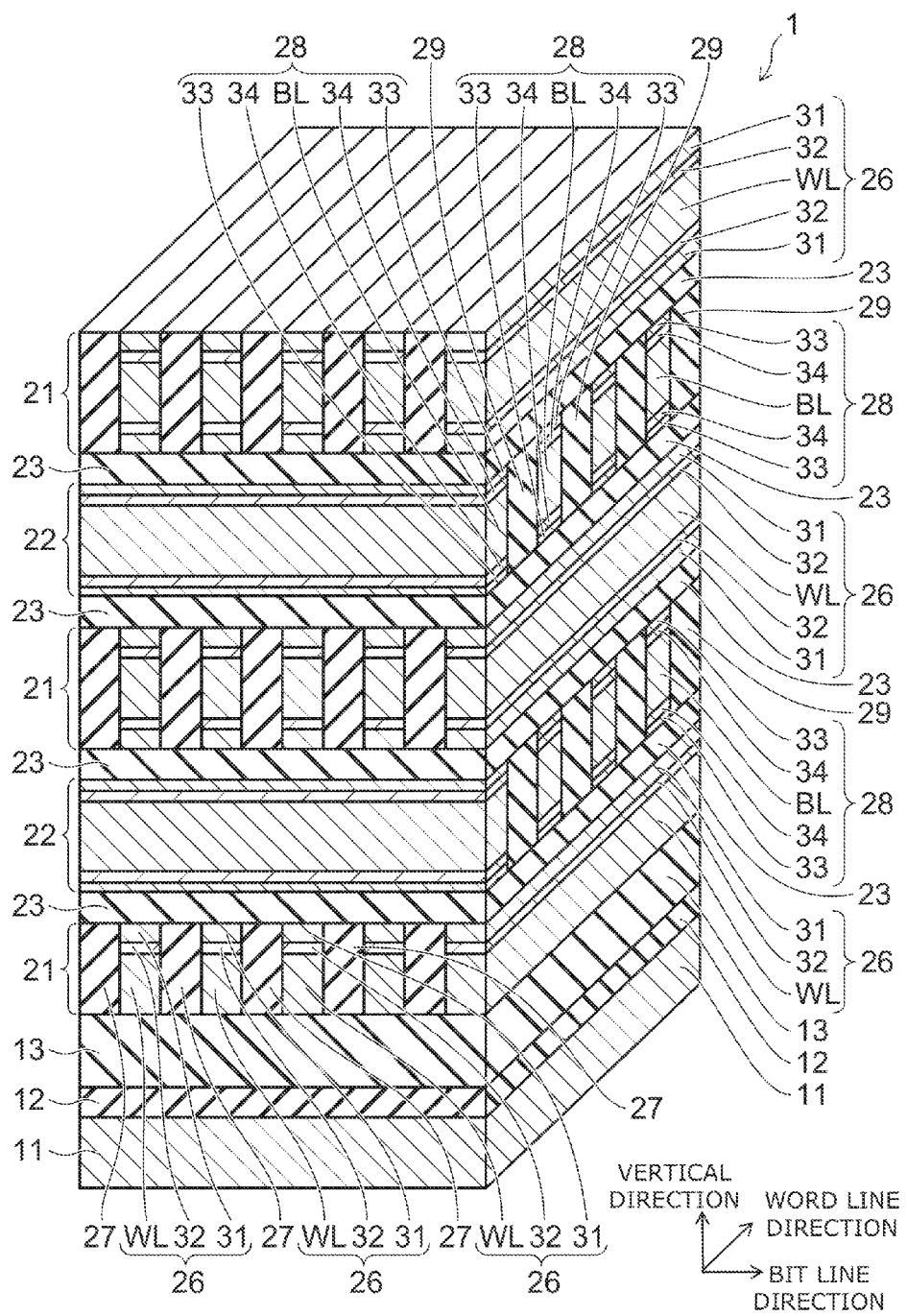
FIG. 1 is a perspective sectional view illustrating a conductive bridging memory device according to a first embodiment.

FIG. 1 is a perspective sectional view illustrating a conductive bridging memory device according to the embodiment.

As shown in FIG. 1, the conductive bridging memory device 1 (hereinafter also simply referred to as "device 1") according to the embodiment includes a silicon substrate 11. On the silicon substrate 11, a multilayer wiring layer 12 is provided. In the upper surface of the silicon substrate 11 and inside the multilayer wiring layer 12, driver circuits (not shown) for driving the device 1 are formed. On the multilayer wiring layer 12, an interlayer insulating film 13 is provided.

On the interlayer insulating film 13, a cross-point memory section is provided. The memory section includes a plurality of word line wiring layers 21 and bit line wiring layers 22 stacked alternately. Between each adjacent pair of the word line wiring layer 21 and the bit line wiring layer 22, one resistance change layer 23 is provided. That is, on the interlayer insulating film 13, sequentially from the bottom, a word line wiring layer 21, a resistance change layer 23, a bit line wiring layer 22, a resistance change layer 23, a word line wiring layer 21, a resistance change layer 23, . . . are stacked in this order. Each resistance change layer 23 is a single continuous film.

The word line wiring layer 21 includes a plurality of word line wiring portions 26 extending in one direction (hereinafter referred to as "word line direction") parallel to the upper surface of the silicon substrate 11. Between the word line wiring portions 26 in the word line wiring layer 21, an interwiring insulating film 27 extending in the word line direction is provided. In each word line wiring portion 26, a word line WL, a barrier layer 32, and a counter electrode layer 31 extending in the word line direction are stacked. The counter electrode layer 31 is placed between the word line WL and the resistance change layer 23. The barrier layer 32 is placed between the word line WL and the counter electrode layer 31.

Thus, in the word line wiring portion 26 belonging to the lowermost word line wiring layer 21, the barrier layer 32 and the counter electrode layer 31 are placed only on the upper surface of the word line WL. That is, sequentially from the bottom, the word line WL, the barrier layer 32, and the counter electrode layer 31 are stacked. On the other hand, in the word line wiring portion 26 belonging to the word line wiring layers 21 except the lowermost word line wiring layer 21, the barrier layer 32 and the counter electrode layer 31 are placed on both the upper surface and lower surface of the word line WL. That is, sequentially from the bottom, a counter electrode layer 31, a barrier layer 32, a word line WL, a barrier layer 32, and a counter electrode layer 31 are stacked.

The bit line wiring layer 22 includes a plurality of bit line wiring portions 28 extending in one direction (hereinafter referred to as "bit line direction") being parallel to the upper surface of the silicon substrate 11 and crossing (e.g., being orthogonal to) the word line direction. Between the bit line wiring portions 28 in the bit line wiring layer 22, an interwiring insulating film 29 extending in the bit line direction is provided. In each bit line wiring portion 28, a bit line BL, a barrier layer 34, and an ion metal layer 33 extending in the bit line direction are provided. The ion metal layer 33 is placed between the bit line BL and the resistance change layer 23. The barrier layer 34 is placed between the bit line BL and the ion metal layer 33.

Thus, in the bit line wiring portion 28, the barrier layer 34 and the ion metal layer 33 are placed on both the upper surface and lower surface of the bit line BL. That is, sequentially from the bottom, an ion metal layer 33, a barrier layer 34, a bit line BL, a barrier layer 34, and an ion metal layer 33 are stacked.

The resistance change layer 23 is a high resistance layer formed from amorphous silicon and the like, or insulating layer formed from silicon oxide, silicon nitride, or transition metal oxide and the like, for example. The resistance change layer 23 is provided continuously along the plane including the word line direction and the bit line direction.

The counter electrode layer 31 has preferably conductively, rectification capability and current limit capability. The counter electrode layer 31 is formed from e.g. polysilicon doped with impurity. The ion metal layer 33 contains a material which produces ions with supplying voltage, can diffuse in the resistance change layer 23, and has conductivity when precipitated as a simple substance. Examples of such a material includes silver (Ag), copper (Cu), nickel (Ni), cobalt (Co), aluminum (Al), titanium (Ti), tellurium (Te), indium (In), chromium (Cr), iron (Fe), lithium (Li), sodium (Na), calcium (Ca), and gold (Au). In addition, the ion metal layer 33 does not need to be a layer that the above-mentioned metal exists as a simple substance. For example, the ion metal layer 33 may be formed from an alloy with different-species metal, an oxide, a nitride or a halogen compound of the above-mentioned metal and the like.

The word line WL and the bit line BL are formed from a conductive material, such as a metal. In particular, the word line WL and the bit line BL are preferably formed from a metal allowing easy film formation and processing, and having low resistivity. Examples of the metal satisfying such conditions include tungsten (W) and molybdenum (Mo). The word line WL and the bit line BL are connected to the driver circuits via contacts (not shown).

The barrier layer 32 is formed from such a material that can ensure adhesiveness between the word line WL and the counter electrode layer 31 and prevent diffusion of atoms constituting the word line WL or the counter electrode layer 31. The barrier layer 34 is formed from such a material that can ensure adhesiveness between the bit line BL and the ion metal layer 33 and prevent diffusion of atoms constituting the bit line BL or the ion metal layer 33. The barrier layers 32 and 34 are formed from e.g. titanium nitride (TiN). The interlayer insulating film 13, the interwiring insulating film 27, and the interwiring insulating film 29 are formed from e.g. silicon oxide.

Next, the operation of the conductive bridging memory device according to the embodiment is described.

FIGS. 2A and 2B are sectional views illustrating the operation of the conductive bridging memory device according to the embodiment.

In FIGS. 2A and 2B, for clarity of illustration, the barrier layers are not shown.

As shown in FIG. 2A, in the conductive bridging memory device 1 according to the embodiment, the nearest portion of one bit line BL and one word line WL is used as one memory cell MS. In each memory cell MS, between the bit line BL and the word line WL, the ion metal layer 33, the resistance change layer 23, and the counter electrode layer 31 are interposed and connected in series. The resistance change layer 23 itself has high resistance. Thus, in the initial state, the resistance state between the bit line BL and the word line WL is in the "high resistance state". This state is assigned with the value "0", for instance.

As shown in FIG. 2B, a relatively positive potential (+Vset) is applied to one bit line BL, and a relatively negative potential (GND) is applied to one word line WL. Then, between these bit line BL and word line WL, silver atoms contained in the ion metal layer 33 become cations by losing electrons and migrate toward the word line WL in the resistance change layer 23. Furthermore, in the resistance change layer 23, the cations are combined with electrons supplied from the counter electrode layer 31 and precipitated. Thus, in the resistance change layer 23, a filament 40 is formed from the ion metal layer 33 to the counter electrode layer 31 and constitutes a current path. Consequently, the resistance state between the bit line BL and the word line WL turns to the "low resistance state". This state is assigned with the value "1", for instance. Here, no voltage occurs between the bit line BL and the word line WL equal in potential to each other. Thus, no filament is formed therebetween.

Next, as shown in FIG. 2A, a relatively negative potential (GND) is applied to the bit line BL, and a relatively positive potential (+Vset) is applied to the word line WL. Then, silver atoms in the resistance change layer 23 become cations and migrate toward the bit line BL. Thus, the filament 40 is separated from the counter electrode layer 31. Consequently, the resistance state between the bit line BL and the word line WL returns to the "high resistance state", and assumes the value "0". Thus, in the device 1, by migration of conductive ions, the resistance state of the memory cell can be switched between the "low resistance state" and the "high resistance state". Accordingly, each memory cell MS can store binary data.

The counter electrode layer 31 and the barrier layer 32 formed on the upper surface and lower surface of the word line WL extend in the word line direction. However, in the bit line direction, the counter electrode layer 31 and the barrier layer 32 are divided for each word line WL. On the other hand, the ion metal layer 33 and the barrier layer 34 formed on the upper surface and lower surface of the bit line BL extend in the bit line direction. However, in the word line direction, the ion metal layer 33 and the barrier layer 34 are divided for each bit line BL. The resistance change layer 23 is formed as one continuous layer and extends along both the word line direction and the bit line direction. However, the resistance change layer 23 itself has high resistance. The filament 40 is formed along the direction in which the electric field between the bit line BL and the word line WL is maximized, i.e., the vertical direction. The filament 40 is not formed along the direction of connecting the adjacent memory cells in the word line direction or the bit line direction. For the foregoing reasons, between the adjacent memory cells in the word line direction or the bit line direction, no effective current path is formed. Thus, in the device 1, the leakage current between the memory cells MS is very small.

Next, a method for manufacturing a conductive bridging memory device according to the embodiment is described.

FIGS. 3A to 3D are process sectional views illustrating the method for manufacturing a conductive bridging memory device according to the embodiment.

Figure 4:
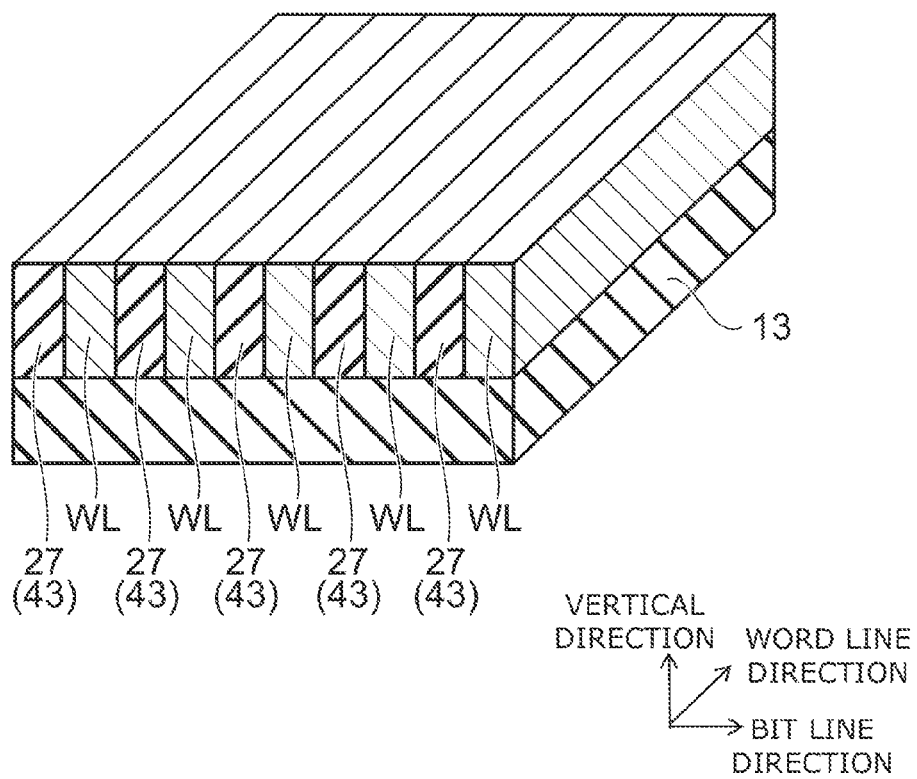
FIG. 4 is a process perspective sectional view illustrating the method for manufacturing the conductive bridging memory device according to the first embodiment.

FIG. 4 is a process perspective sectional view illustrating the method for manufacturing a conductive bridging memory device according to the embodiment.

Figure 5A:
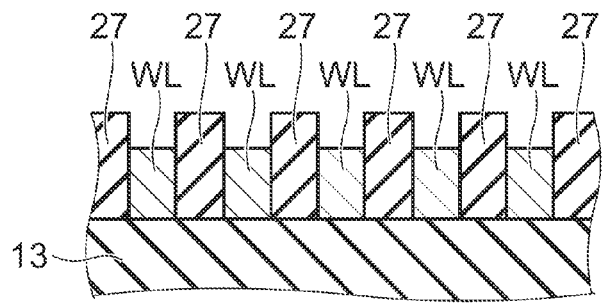
FIGS. 5A to 5C are process sectional views illustrating the method for manufacturing the conductive bridging memory device according to the first embodiment.
Figure 5B:
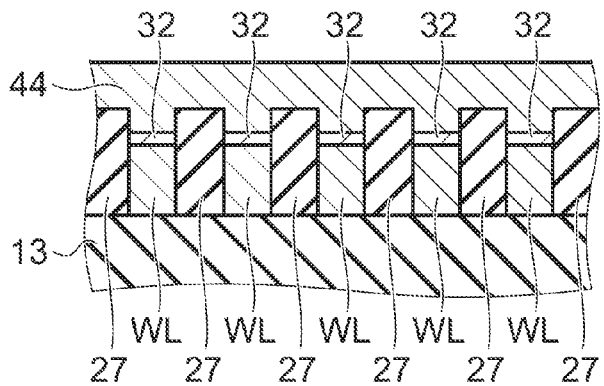
Figure 5C:
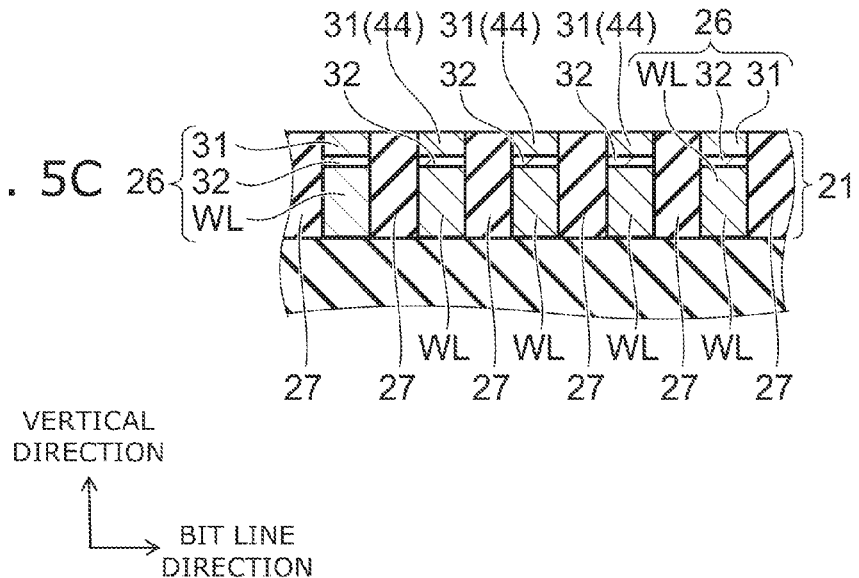

FIGS. 5A to 5C are process sectional views illustrating the method for manufacturing a conductive bridging memory device according to the embodiment.

Figure 6:
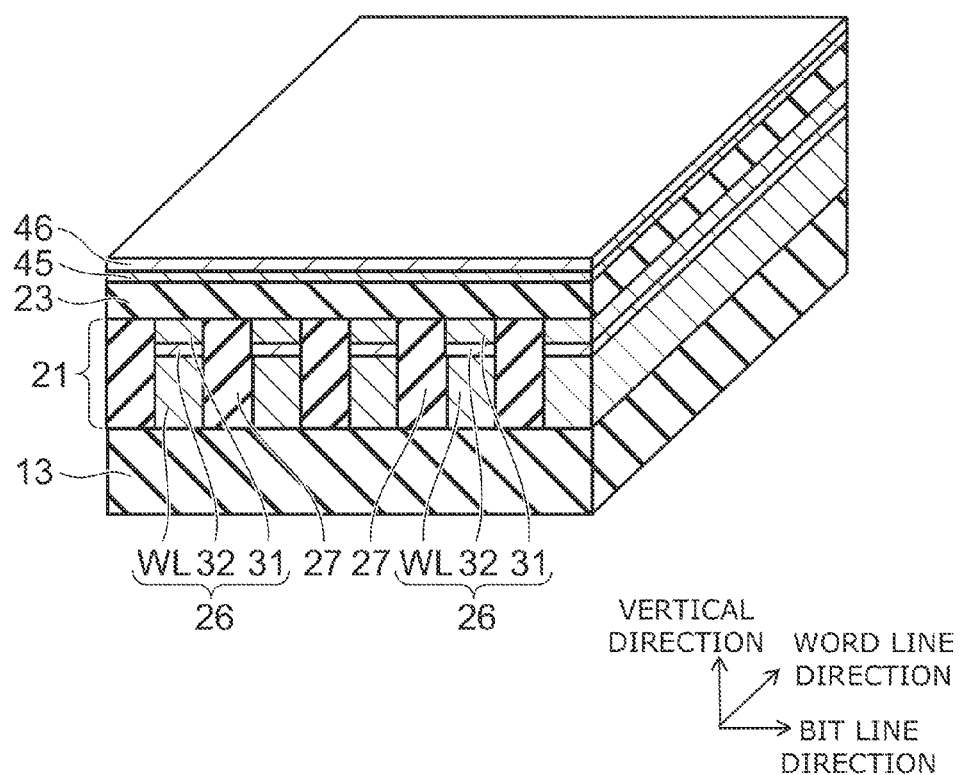
FIG. 6 is a process perspective sectional view illustrating the method for manufacturing the conductive bridging memory device according to the first embodiment.

FIG. 6 is a process perspective sectional view illustrating the method for manufacturing a conductive bridging memory device according to the embodiment.

Figure 7A:
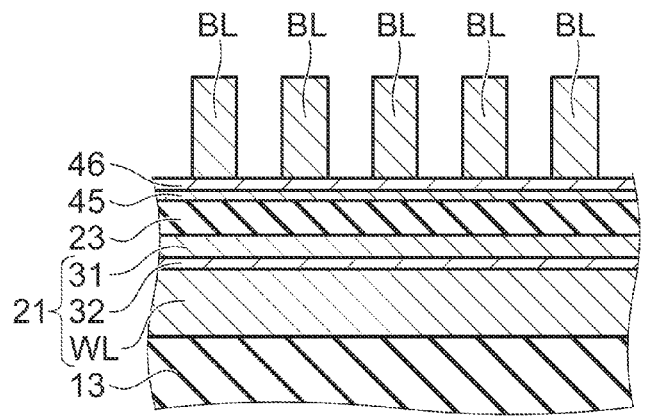
FIGS. 7A and 7B are process sectional views illustrating the method for manufacturing the conductive bridging memory device according to the first embodiment.
Figure 7B:
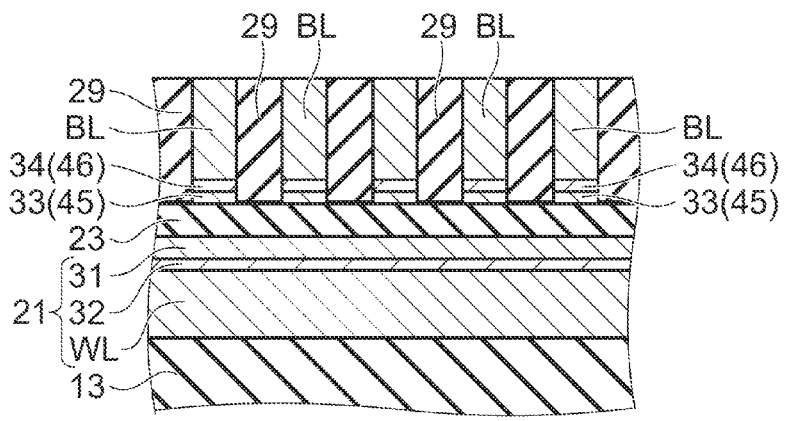

FIGS. 7A and 7B are process sectional views illustrating the method for manufacturing a conductive bridging memory device according to the embodiment.

Figure 8A:
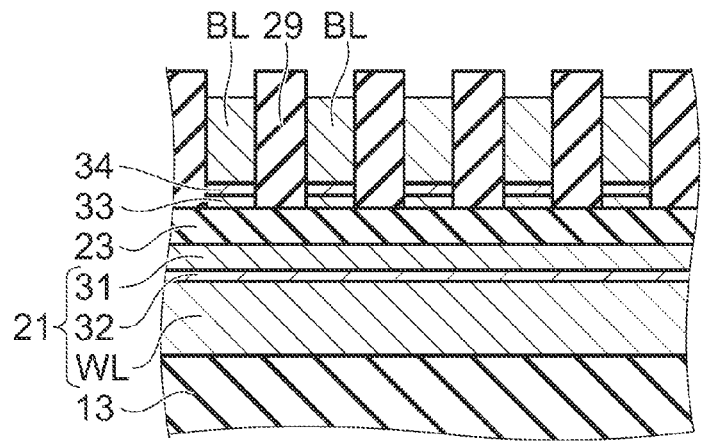
FIGS. 8A and 8B are process sectional views illustrating the method for manufacturing the conductive bridging memory device according to the first embodiment.
Figure 8B:
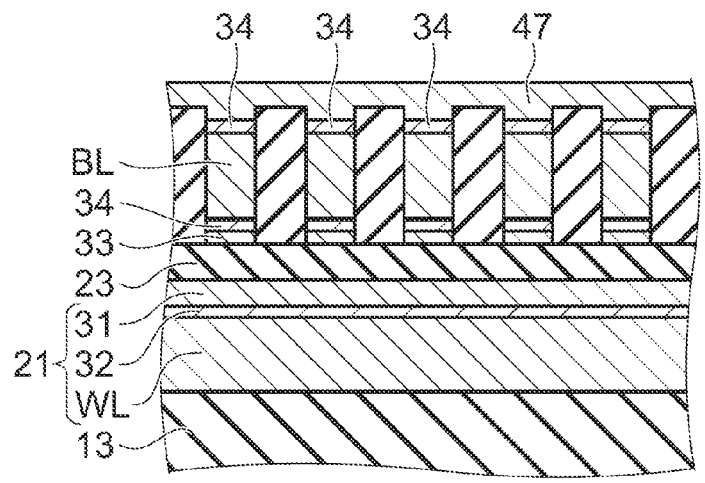

FIGS. 8A and 8B are process sectional views illustrating the method for manufacturing a conductive bridging memory device according to the embodiment.

Figure 9:
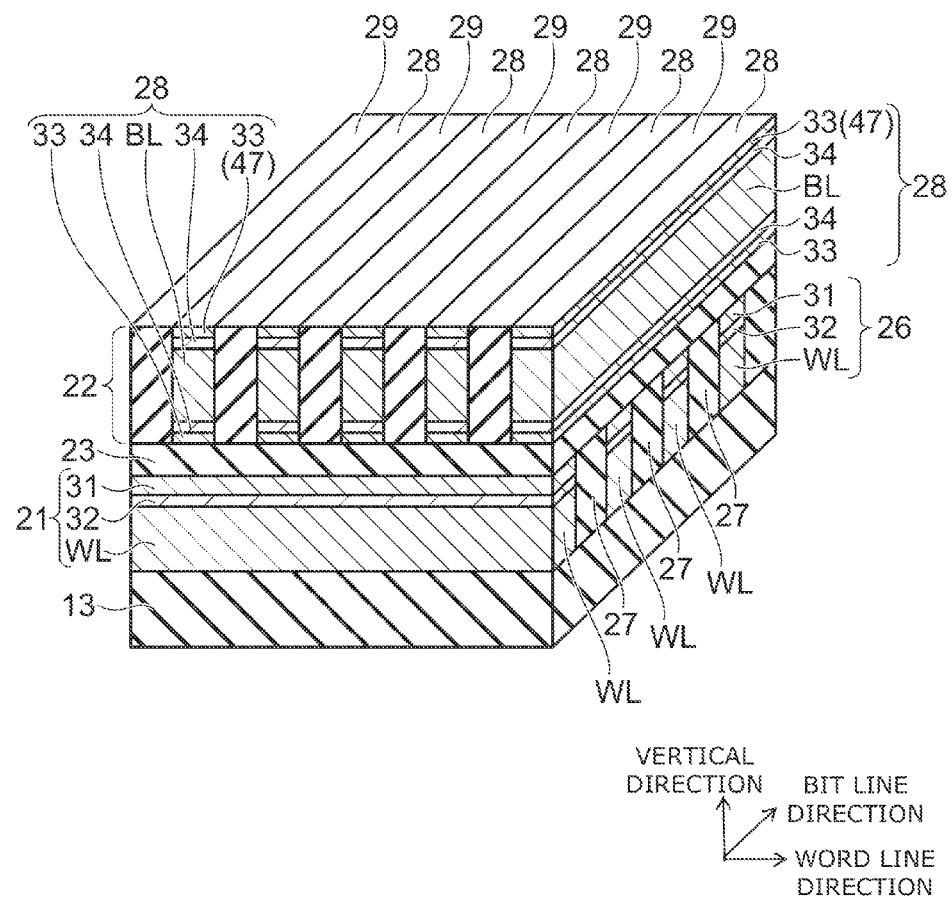
FIG. 9 is a process perspective sectional view illustrating the method for manufacturing the conductive bridging memory device according to the first embodiment.

FIG. 9 is a process perspective sectional view illustrating the method for manufacturing a conductive bridging memory device according to the embodiment.

Figure 10A:
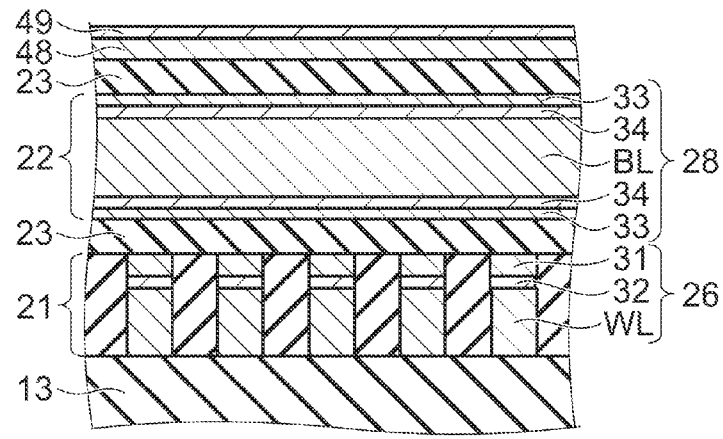
FIGS. 10A and 10B are process sectional views illustrating the method for manufacturing the conductive bridging memory device according to the first embodiment.
Figure 10B:
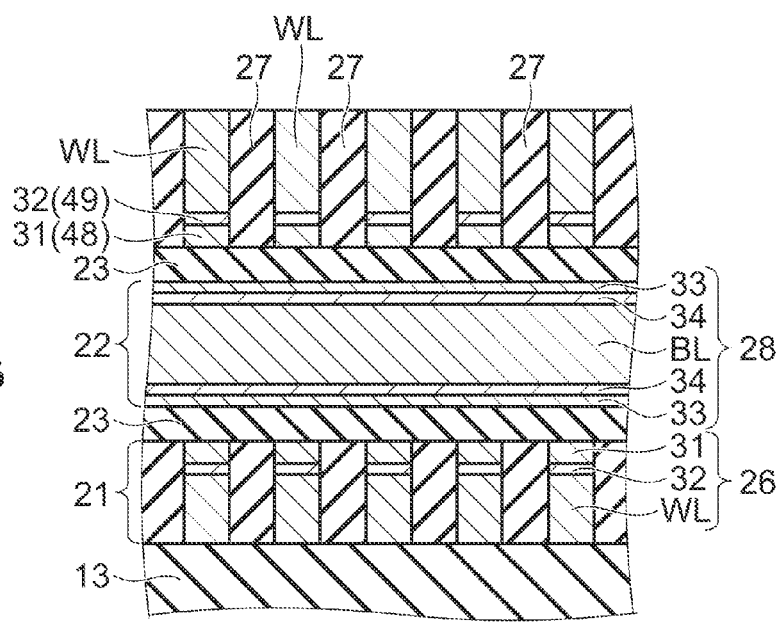
Figure 10B:
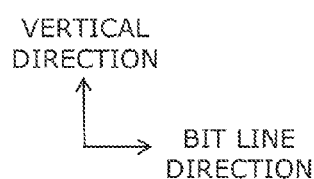

FIGS. 10A and 10B are process sectional views illustrating the method for manufacturing a conductive bridging memory device according to the embodiment.

First, as shown in FIG. 1, a silicon substrate 11 is prepared. Then, in the upper surface of the silicon substrate 11, circuit elements such as p-type MOSFET (metal-oxide-semiconductor field-effect transistor) and n-type MOSFET are formed. Next, a multilayer wiring layer 12 is formed on the silicon substrate 11. Thus, driver circuits (not shown) of the device 1 are formed. Next, on the multilayer wiring layer 12, silicon oxide is deposited by e.g. the LPCVD (low pressure chemical vapor deposition) method to form an interlayer insulating film 13.

FIGS. 3A to 3D and FIGS. 5A to 5C described below show a cross section parallel to the bit line direction.

Figure 3A:
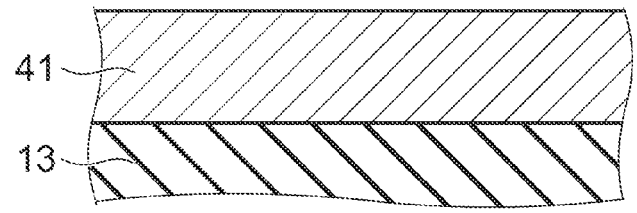
FIGS. 3A to 3D are process sectional views illustrating a method for manufacturing a conductive bridging memory device according to the first embodiment.

As shown in FIG. 3A, on the interlayer insulating film 13, tungsten (W), for instance, is deposited to form a metal film 41.

Figure 3B:
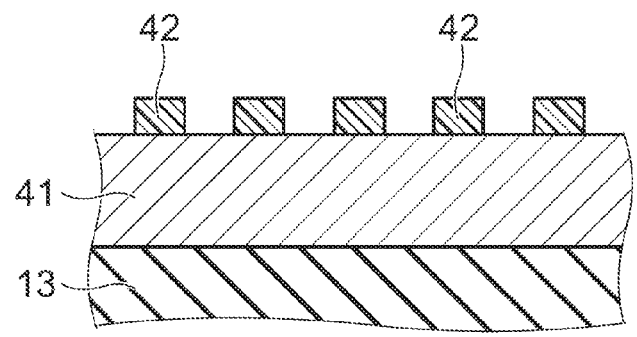

Next, as shown in FIG. 3B, a photoresist film is formed on the metal film 41. By the lithography method, the photoresist film is processed into a line-and-space (L/S) pattern extending in the word line direction. Thus, a resist pattern 42 is formed on the metal film 41.

Figure 3C:
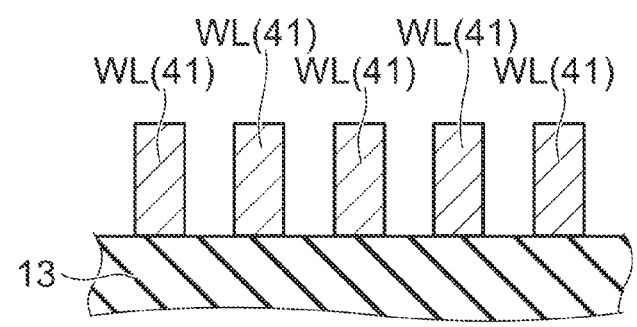

Next, as shown in FIG. 3C, the resist pattern 42 is used as a mask to perform anisotropic etching such as RIE (reactive ion etching) on the metal film 41. Thus, the metal film 41 is selectively removed to form a plurality of word lines WL extending in the word line direction.

Figure 3D:
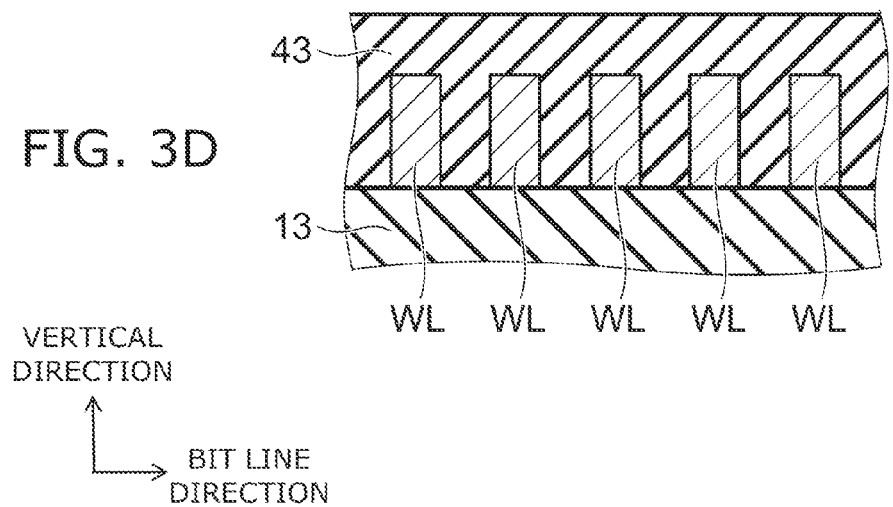

Next, as shown in FIG. 3D, silicon oxide, for instance, is deposited to form an insulating film 43 so as to cover the word lines WL.

Next, as shown in FIG. 4, the word lines WL are used as a stopper to perform planarization such as CMP (chemical mechanical polishing) on the insulating film 43. Thus, the insulating film 43 remaining between the word lines WL constitutes an interwiring insulating film 27. Consequently, on the interlayer insulating film 13 is fabricated a structural body in which the word lines WL extending in the word line direction and the interwiring insulating films 27 extending in the word line direction are alternately arranged along the bit line direction.

Next, as shown in FIG. 5A, by e.g. wet etching, an upper portion of the word line WL is removed. Thus, the upper surface of the word line WL is set back and located below the upper surface of the interwiring insulating film 27.

Next, as shown in FIG. 5B, a barrier layer 32 is formed on the upper surface of the word line WL between the interwiring insulating films 27. Here, the thickness of the barrier layer 32 is made smaller than the amount of set back of the upper surface of the word line WL. In FIG. 5B, the barrier layer 32 is depicted in a planar shape. However, actually, the barrier layer 32 may have a square U-shape along the inner surface of the groove formed by the interwiring insulating films 27 and the word line WL. Even in this case, there is no particular problem. Next, a conductive film 44 is formed on the entire surface.

Next, as shown in FIG. 5C, CMP is performed on the conductive film 44 using the interwiring insulating films 27 as a stopper. Thus, the conductive film 44 remains only immediately above the barrier layer 32 and constitutes a counter electrode layer 31. Consequently, between the interwiring insulating films 27, the word line WL, the barrier layer 32, and the counter electrode layer 31 are stacked in this order. Thus, a plurality of word line wiring portions 26 extending in the word line direction are formed. Furthermore, a word line wiring layer 21 with the word line wiring portions 26 and the interwiring insulating films 27 alternately arranged therein is formed. Thus, in the embodiment, the word line wiring layer 21 is formed by a combination of the RIE method and the damascene method. Here, the etching amount of the wet etching step shown in FIG. 5A is determined from the thickness required for the barrier layer 32 and the counter electrode layer 31.

Next, as shown in FIG. 6, a resistance change layer 23 made of non-doped amorphous silicon is formed on the entire surface. Next, a metal layer 45 containing e.g. silver (Ag) is formed on the entire surface. Next, a barrier layer 46 is formed on the entire surface. The resistance change layer 23, the metal layer 45, and the barrier layer 46 are formed as continuous films.

FIGS. 7A and 7B and FIGS. 8A and 8B described below show a cross section parallel to the word line direction.

As shown in FIG. 7A, by the RIE method similar to that for the aforementioned word lines WL, a plurality of bit lines BL extending in the bit line direction are formed on the barrier layer 46.

Next, as shown in FIG. 7B, the bit lines BL are used as a mask to perform anisotropic etching such as RIE. Thus, the barrier layer 46 and the metal layer 45 are selectively removed. Accordingly, the barrier layer 46 is divided into a plurality of barrier layers 34, and the metal layer 45 is divided into a plurality of ion metal layers 33. Here, the resistance change layer 23 is not positively etched. However, for reliable division of the ion metal layers 33, preferably, the etching is performed slightly overly. This may etch the upper portion of the resistance change layer 23, but causes no problem. However, even in this case, the resistance change layer 23 is not divided.

Next, silicon oxide is deposited on the entire surface and subjected to planarization such as CMP. Thus, an interwiring insulating film 29 is formed between the stacked bodies each made of the ion metal layer 33, the barrier layer 34, and the bit line BL.

Next, as shown in FIG. 8A, by e.g. wet etching, an upper portion of the bit line BL is removed.

Next, as shown in FIG. 8B, a barrier layer 34 is formed on the upper surface of the bit line BL between the interwiring insulating films 29. Next, a metal layer 47 is formed on the entire surface.

Next, as shown in FIG. 9, planarization such as CMP is performed on the metal layer 47. Thus, the metal layer 47 remains only immediately above the bit line BL and constitutes an ion metal layer 33. Accordingly, between the interwiring insulating films 29 is formed a bit line wiring portion 28 in which the ion metal layer 33, the barrier layer 34, the bit line BL, the barrier layer 34, and the ion metal layer 33 are stacked in this order. Consequently, on the resistance change layer 23, a bit line wiring layer 22 with the bit line wiring portions 28 and the interwiring insulating films 29 alternately arranged along the word line direction is formed. Thus, like the word line wiring layer 21, the bit line wiring layer 22 is also formed by a combination of the RIE method and the damascene method.

FIGS. 10A and 10B described below show a cross section parallel to the bit line direction.

As shown in FIG. 10A, on the bit line wiring layer 22, a resistance change layer 23 is formed on the entire surface. A conductive film 48 is formed on the entire surface. A barrier layer 49 is formed on the entire surface.

Next, as shown in FIG. 10B, by the RIE method, a plurality of word lines WL are formed on the barrier layer 49. Next, the word lines WL are used as a mask to perform anisotropic etching such as RIE. Thus, the barrier layer 49 is divided into a plurality of barrier layers 32, and the conductive film 48 is divided into a plurality of counter electrode layers 31. Here, the resistance change layer 23 is not positively etched. Nevertheless, the etching of the counter electrode layer 31 may result in etching the upper portion of the resistance change layer 23. However, even in this case, the resistance change layer 23 is not divided. Next, an interwiring insulating film 27 is formed between the stacked bodies each made of the counter electrode layer 31, the barrier layer 32, and the word line WL.

Next, as shown in FIG. 1, like the method shown in FIGS. 5A to 5C described above, by the damascene method, a barrier layer 32 and a counter electrode layer 31 are formed on the word line WL. Thus, a second-layer word line wiring layer 21 is formed.

Subsequently, likewise, a resistance change layer 23, a bit line wiring layer 22, a resistance change layer 23, a word line wiring layer 21, a resistance change layer 23, . . . are formed in this order. Next, contacts (not shown) are formed to connect the word lines WL and the bit lines BL to the driver circuits. Thus, the conductive bridging memory device 1 according to the embodiment is manufactured.

Next, the effect of the embodiment is described.

In the embodiment, in the step shown in FIG. 7B, by using the bit lines BL as a mask, the barrier layer 46 and the metal layer 45 are etched to form barrier layers 34 and ion metal layers 33. Furthermore, in the step shown in FIG. 10B, by using the word lines WL as a mask, the barrier layer 49 and the conductive film 48 are etched to form barrier layers 32 and counter electrode layers 31. Thus, in the embodiment, it is not the case where the stacked body made of the barrier layer 34 and the ion metal layer 33, and the stacked body made of the barrier layer 32 and the counter electrode layer 31 are divided along two directions and processed into a pillar shape. Instead, in the embodiment, the stacked body is divided along only one direction and formed in a line-and-space shape. Consequently, in the pattern of these stacked bodies formed by etching, buckling and collapse are less likely to occur.

Furthermore, in these etching steps, the resistance change layer 23 is not positively etched. Thus, the aspect ratio in etching can be suppressed to be low. This can prevent buckling and collapse of the pattern more reliably.

Thus, according to the embodiment, etching is performed along the L/S pattern, and the aspect ratio is suppressed to be low by not etching the resistance change layer 23. This facilitates etching. Thus, even if the arrangement pitch of word lines WL and bit lines BL is reduced to increase the degree of integration of memory cells, the difficulty in etching can be suppressed.

On the other hand, as described above, in the conductive bridging memory device according to the embodiment, it is only the resistance change layer 23 having relatively high resistance that extends in both the word line direction and the bit line direction in the memory section. The layers having relatively low resistance are divided in a necessary direction. That is, the counter electrode layer 31 and the barrier layer 32 are divided in the bit line direction. The ion metal layer 33 and the barrier layer 34 are divided in the word line direction. Hence, the leakage current between memory cells can be sufficiently suppressed.

Thus, according to the embodiment, a conductive bridging memory device easy to manufacture can be realized while suppressing the leakage current between memory cells.

In contrast, suppose that the counter electrode layer 31, the barrier layer 32, the ion metal layer 33, and the barrier layer 34 are also continuous films like the resistance change layer 23. This would eliminate the need to etch these layers, and hence facilitate processing. However, a leakage current flows through these layers. On the other hand, suppose that the resistance change layer 23 is divided in a matrix along both the word line direction and the bit line direction in conjunction with the counter electrode layer 31, the barrier layer 32, the ion metal layer 33, and the barrier layer 34. This could effectively suppress the leakage current. However, because the pattern shape takes a pillar shape, the aspect ratio is increased. Thus, miniaturization of memory cells makes etching difficult. Even if etching is feasible, collapse and buckling are more likely to occur.

Here, the upper portion of the resistance change layer 23 may be etched to the extent that etching is not made difficult and the incidence of collapse and buckling of the pattern is not significantly increased. This can divide the counter electrode layer 31 and the ion metal layer 33 more reliably, and prevent the occurrence of leakage current more reliably.

Furthermore, in the embodiment, in each wiring layer, the layer formed above each wiring is formed by the damascene method. More specifically, in the steps shown in FIGS. 5A to 5C, in forming the word line wiring layer 21, an upper portion of the word line WL is removed to form a space between the interwiring insulating films 27. A barrier layer 32 and a counter electrode layer 31 are formed in the space between the interwiring insulating films 27. As shown in FIGS. 8A and 8B, an upper portion of the bit line BL is removed to form a space between the interwiring insulating films 29. A barrier layer 34 and an ion metal layer 33 are formed in the space between the interwiring insulating films 29. Thus, on each wiring, layers extending along the wiring can be formed in a self-aligned manner. Furthermore, the interface control between the layers is facilitated. Moreover, the aspect ratio is reduced in processing the wiring by RIE. This facilitates processing.

Next, a second embodiment is described.

The embodiment is different from the above first embodiment in the method of forming word lines WL and bit lines BL.

FIGS. 11A to 11C and FIGS. 12A to 12C are process sectional views illustrating a method for manufacturing a conductive bridging memory device according to the embodiment.

First, as shown in FIG. 1, like the above first embodiment, a multilayer wiring layer 12 and an interlayer insulating film 13 are formed on the silicon substrate 11.

Figure 11A:
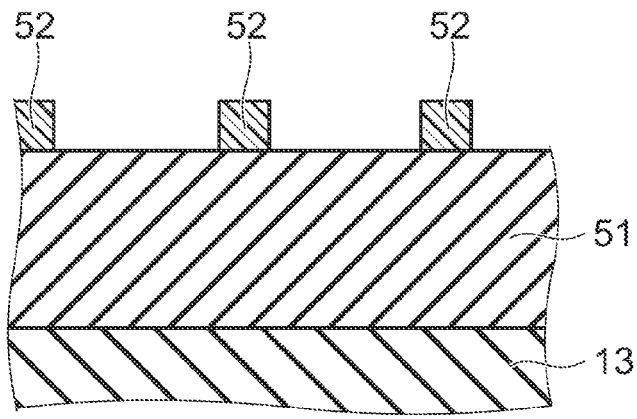
FIGS. 11A to 11C and FIGS. 12A to 12C are process sectional views illustrating a method for manufacturing a conductive bridging memory device according to a second embodiment.

Next, as shown in FIG. 11A, for instance, silicon nitride is deposited. Thus, on the interlayer insulating film 13, a core layer 51 is formed on the entire surface. Here, the material of the core layer 51 is not limited to silicon nitride. The material of the core layer 51 only needs to be a material allowing a sufficient selection ratio with respect to the metal film 54 subjected to sidewall processing in the step shown in FIG. 12A described later. For instance, the material of the core layer 51 may also be silicon oxide. Next, on the core layer 51, a photoresist film is formed on the entire surface and processed into an L/S pattern by the lithography method. Thus, a resist pattern 52 extending in the word line direction is formed.

Figure 11B:
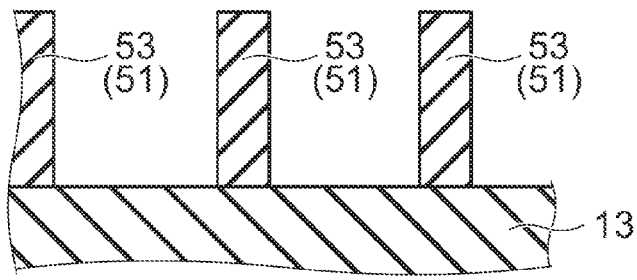

Next, as shown in FIG. 11B, the resist pattern 52 is used as a mask to perform anisotropic etching such as RIE on the core layer 51. Thus, the core layer 51 is selectively removed to form a plurality of cores 53 extending in the word line direction. Here, as necessary, the width of the core 53 may be thinned by e.g. wet etching.

Figure 11C:
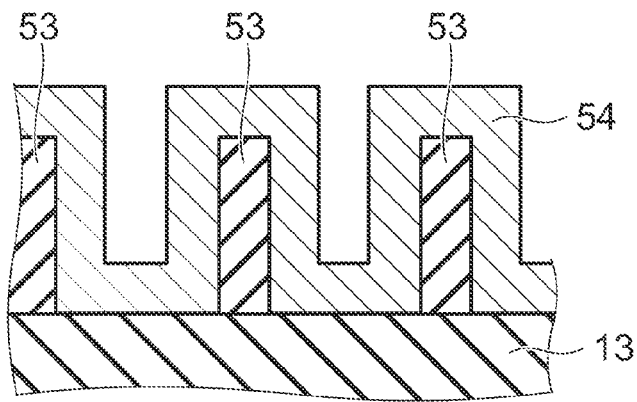

Next, as shown in FIG. 11C, a metal such as tungsten or molybdenum is deposited to conformally form a metal film 54.

Figure 12A:
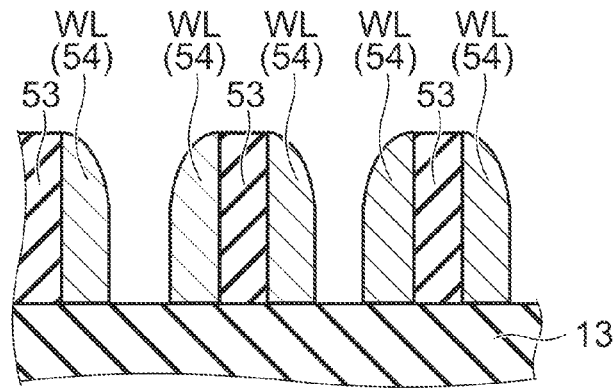

Next, as shown in FIG. 12A, anisotropic etching such as RIE is performed on the metal film 54. This removes the portion of the metal film 54 located on the upper surface of the interlayer insulating film 13 and on the upper surface of the core 53. The portion of the metal film 54 located on the side surface of the core 53 remains. This remaining portion shaped like a sidewall constitutes a word line WL. Thus, word lines WL are formed at an arrangement pitch of half the arrangement pitch of the resist pattern 52. Here, in the step shown in FIG. 11C described above, the film thickness of the metal film 54 is determined so that the wiring width of the word line WL has a desired value.

Figure 12B:
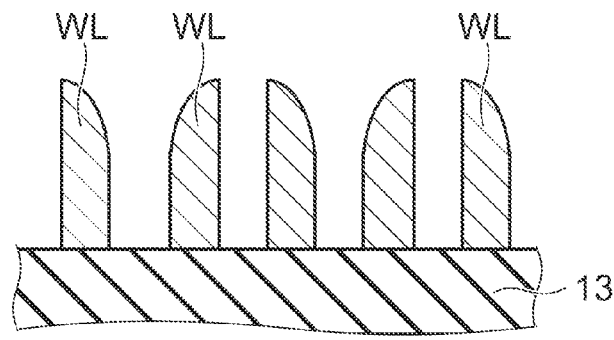

Next, as shown in FIG. 12B, the core 53 is removed by e.g. wet etching.

Figure 12C:
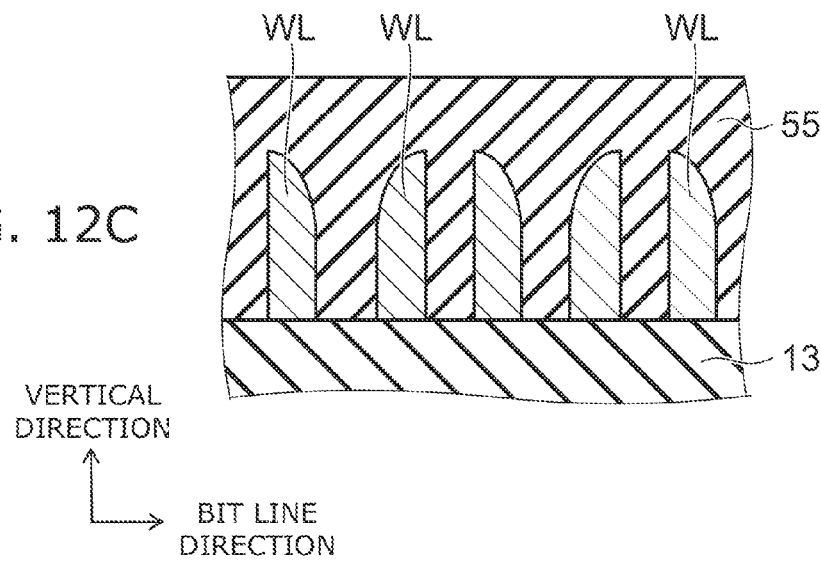

Next, as shown in FIG. 12C, an insulating material such as silicon oxide is deposited to form an insulating film 55 so as to bury the word lines WL. Next, the word lines WL are used as a stopper to perform planarization such as CMP. Here, in order to reduce variations in the shape of the word lines WL, preferably, the planarization is performed slightly overly to remove the upper end portion of the word lines WL. Thus, a structural body as shown in FIG. 4 is fabricated. As described above, in the embodiment, the word lines WL are formed by the sidewall method.

The subsequent steps are similar to the steps shown in FIGS. 5A to 10B. However, in the embodiment, the word lines WL and the bit lines BL are formed not by the RIE method as in the above first embodiment, but by the sidewall method as described above. In this case, etching of the layers located below each wiring is performed after removing the core 53 and before forming the insulating film 55. The layers located above each wiring are formed by the damascene method.

More specifically, the step of forming an ion metal layer 33 and a barrier layer 34 shown in FIG. 7B is performed as follows. As shown in FIG. 7A, bit lines BL are formed above the metal layer 45 and the barrier layer 46. Then, as shown in FIG. 12B, the core 53 is removed. Subsequently, RIE is additionally performed to selectively remove the barrier layer 46 and the metal layer 45 using the bit lines BL as a mask. Then, as shown in FIG. 12C, an insulating film 55 is formed and subjected to planarization such as CMP. Thus, as shown in FIG. 7B, an interwiring insulating film 29 is formed. Then, as shown in FIGS. 8A and 8B, an upper portion of the bit line BL is removed to set back the upper surface. Thus, a barrier layer 34 and an ion metal layer 33 are formed.

Similarly, the step of forming a counter electrode layer 31 and a barrier layer 32 shown in FIG. 10B is performed as follows. Word lines WL are formed on the conductive film 48 and the barrier layer 49. Then, as shown in FIG. 12B, the core 53 is removed. Subsequently, RIE using the word lines WL as a mask is performed to selectively remove the barrier layer 49 and the conductive film 48. Then, as shown in FIG. 12C, an insulating film 55 is formed and subjected to CMP. Thus, as shown in FIG. 10B, an interwiring insulating film 27 is formed. Then, an upper portion of the word line WL is removed to set back the upper surface. Thus, a barrier layer 32 and a counter electrode layer 31 are formed.

As described above, in the embodiment, the word line wiring layer 21 and the bit line wiring layer 22 are formed by the sidewall method and the damascene method.

According to the embodiment, the wirings, i.e., the word lines WL and the bit lines BL, are formed by the sidewall method. Thus, compared with the above first embodiment, when the arrangement pitch of the word lines WL and the bit lines BL is made smaller, the difficulty in processing the word lines WL and the bit lines BL can be reduced. This facilitates increasing the degree of integration of memory cells.

On the other hand, according to the above first embodiment, the word lines WL and the bit lines BL are formed by the RIE method. Thus, the number of steps required to form the wirings is smaller, and the manufacturing cost is lower. Furthermore, with regard to RIE for forming the wirings, a resist pattern is used as a mask. This reduces damage associated with etching, and can suppress the increase of resistivity due to damage. Thus, the RIE method and the sidewall method have different advantages, and one of the methods can be selected in view of these advantages.

The configuration, operation, manufacturing method, and effect of the embodiment other than the foregoing are similar to those of the above first embodiment.

In the example described above, in the above first embodiment, each wiring layer is formed by the RIE method and the damascene method. In the above second embodiment, each wiring layer is formed by the sidewall method and the damascene method. However, one device may be manufactured by using both the RIE method and the sidewall method.

In the example of the above embodiments, a barrier layer 32 is provided between the word line WL and the counter electrode layer 31. A barrier layer 34 is provided between the bit line BL and the ion metal layer 33. However, these barrier layers may be omitted in the case where the absence of these barrier layers does not cause any problems such as the decrease of adhesiveness and the diffusion of constituent elements.

Furthermore, in the above embodiments, the word line WL and the bit line BL may be interchanged.

The embodiments described above can realize a conductive bridging memory device easy to manufacture, and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A conductive bridging memory device comprising:
    a first wiring layer including a plurality of first wiring portions extending in a first direction, the plurality of first wiring portions being arranged along a second direction crossing the first direction;
    a second wiring layer including a plurality of second wiring portions extending in the second direction, the plurality of second wiring portions being arranged along the first direction, the second wiring layer being disposed in a third direction from the first wiring layer, the third direction crossing both the first direction and the second direction; and
    a resistance change layer provided along a plane including the first direction and the second direction between the first wiring layer and the second wiring layer, the resistance change layer being provided continuously across the plurality of first wiring portions and the plurality of second wiring portions,
    one of the first wiring portions including:
        a first wiring extending in the first direction across the plurality of second wiring portions, and
    one of the second wiring portions including:
        a second wiring extending in the second direction across the plurality of first wiring portions; and
        an ion metal layer provided between the second wiring and the resistance change layer and extending in the second direction across the plurality of first wiring portions.

2. The device according to claim 1, wherein each of the first wiring portions further includes a counter electrode layer provided between the first wiring and the resistance change layer and extending in the first direction.

3. The device according to claim 2, wherein the counter electrode layer contains silicon doped with impurity.

4. The device according to claim 1, wherein the resistance change layer contains silicon, and the ion metal layer contains one or more metals selected from the group consisting of silver, copper, nickel, and cobalt.

5. The device according to claim 1, wherein
    the first wiring layers and the second wiring layers are respectively provided in a plurality and alternately stacked, and
    the resistance change layer is provided between each adjacent pair of the first wiring layer and the second wiring layer.

* * * * *